United States Patent [19]

Muehlner et al.

[11] 4,357,684

[45] Nov. 2, 1982

[54] REVERSE-ROTATION TRANSFER GATES

[75] Inventors: Dirk J. Muehlner, Berkeley Heights; Terence J. Nelson; Raymond Wolfe, both of New Providence, all of N.J.

[73] Assignee: Bell Telephone Laboratories, Incorporated, Murray Hill, N.J.

[21] Appl. No.: 203,354

[22] Filed: Nov. 3, 1980

[51] Int. Cl.³ .............................................. G11C 19/08
[52] U.S. Cl. ......................................... 365/36; 365/24
[58] Field of Search ...................... 365/15, 36, 13, 16, 365/41, 24

[56] References Cited

U.S. PATENT DOCUMENTS 4,157,591 6/1979 Dekker et al. ........................ 365/36
4,276,614 6/1981 Nelson et al. .......................... 365/36

Primary Examiner—James W. Moffitt
Attorney, Agent, or Firm—Herbert M. Shapiro

[57] ABSTRACT

Transfer between paths in ion-implanted magnetic bubble memories has been achieved without the use of transfer conductors. The transfer mechanism takes advantage of the three-fold anisotropy of the implanted drive layer which makes it possible for bubbles to pass freely through gaps in one direction while being obstructed from passing through in the other direction. Transfer is controlled by a brief reversal of the direction of rotation of the in-plane field. In one embodiment, a bidirectional transfer gate is employed. Configurations using unidirectional gates and hybrid gates using conductor and reverse-rotation controlled transfer are also shown.

10 Claims, 6 Drawing Figures

REVERSE-ROTATION TRANSFER GATES

FIELD OF THE INVENTION

This invention relates to magnetic bubble memories and more particularly to such memories in which paths for bubble movement are defined by a pattern of ion-implanted regions.

BACKGROUND OF THE INVENTION

Ion-implanted magnetic bubble memories are disclosed in U.S. Pat. No. 3,792,452 of M. Dixon et al., issued Feb. 12, 1974 and U.S. Pat. No. 3,828,329 of R. F. Fischer et al., issued Aug. 6, 1974. In such memories, propagation paths for bubbles are defined by unimplanted regions in the otherwise implanted host layer. Bubbles reside in the implanted region and propagate along the boundary between implanted and unimplanted regions in response to the rotation of an in-plane magnetic drive field. Typically, the unimplanted regions have a contiguous disc geometry, forming a propagation path of interlaced bulges and cusps.

The first of the above-mentioned patents shows the familiar major-minor bubble memory organization. This organization is characterized by a plurality of closed loop propagation paths termed "minor loops" and at least one "major" path. A bubble generator and detector are associated with the major path and data (magnetic bubbles) move between the ends of the minor loops and the major path typically at transfer gates.

Transfer gates generally are defined by an electrical conductor which, when pulsed, causes bubbles to move to one end of the minor loops from associated positions on the major path. There are disadvantages associated with the conventional conductor controlled transfer gates. Long conductor lines, necessary in large chips, are not desirable because of yield loss due to conductor defects, and the need for high voltage pulse generators. Also, there may be stress related conductor crossing problems and the conductor must be precisely aligned with specific portions of the implant pattern to achieve transfer.

BRIEF DESCRIPTION OF THE INVENTION

This invention is directed at a transfer gate arrangement for ion-implanted magnetic bubble memories which is controlled by reversal of the direction of rotation of the in-plane drive field. The transfer gate is formed as part of the ion-implantation pattern that forms the propagation paths and requires no conductor overlay.

The invention utilizes the observation that a narrow gap between unimplanted discs or ends of an ion-implanted contiguous disc propagation track can have the property of allowing magnetic bubbles approaching from one direction to pass through freely, while appearing as a cusp to bubbles approaching from the opposite direction. This anisotropy between directions of approach is due to the threefold anisotropy of the (111) oriented magnetic garnet layer.

This observation has already been exploited to achieve a merging of two paths, as disclosed in copending application Ser. No. 99,556 for T. J. Nelson and R. Wolfe, now U.S. Pat. No. 4,276,614. The present invention makes use of this property in a bubble transfer controlled by a brief reversal of the direction of rotation of the in-plane field.

In one embodiment, a single unimplanted "idler" disc is offset from a gap separating two paths. The gaps between the idler disc and the two paths are aligned with preferred magnetization directions of the implanted area and form a bidirectional transfer gate. A bubble in a first path passes through the gap between the first path and the idler disc. The direction of rotation of the in-plane field is then reversed and the bubble approaches the same gap from the other side. This time the gap appears as a cusp and the bubble transfers to the idler disc. Further reverse rotation of the in-plane field propagates the bubble around the disc through the gap between the disc and the second path. At this point, the direction of the in-plane field is once again reversed. The bubble approaches the second gap, propagates across the gap as across a cusp, and completes the transfer to the second path.

Another embodiment comprises a major-minor organization with separate unidirectional transfer gates at the ends of the minor loops. Here the idler is no longer a simple disc but it performs the transfer function.

A "hybrid" transfer gate employing both conductor and reverse rotation control is also shown. Here, the major path is formed by a series of multistage unimplanted islands separated by gaps. Transfer-in is accomplished by pulsing the conductor to drive the bubbles through the gaps and onto the minor loop. Transfer-out is accomplished by a reverse rotation transfer without conductor assistance. This transfer-in gate has the advantage that there is no net position gain or loss in the transfer-in/transfer-out sequence, (that is bubble position with respect to associated vacancies) so that with appropriate numbers of major and minor loop stages, a block of data may be transferred out of the minor loops and propagate around the major loop an arbitrary number of times before being transferred back to its proper place on the minor loops. Consequently any power failure recovery scheme need not be constrained to advance a block of data only to the first arrival at the transfer-in gates.

DETAILED DESCRIPTION

Figure 1:
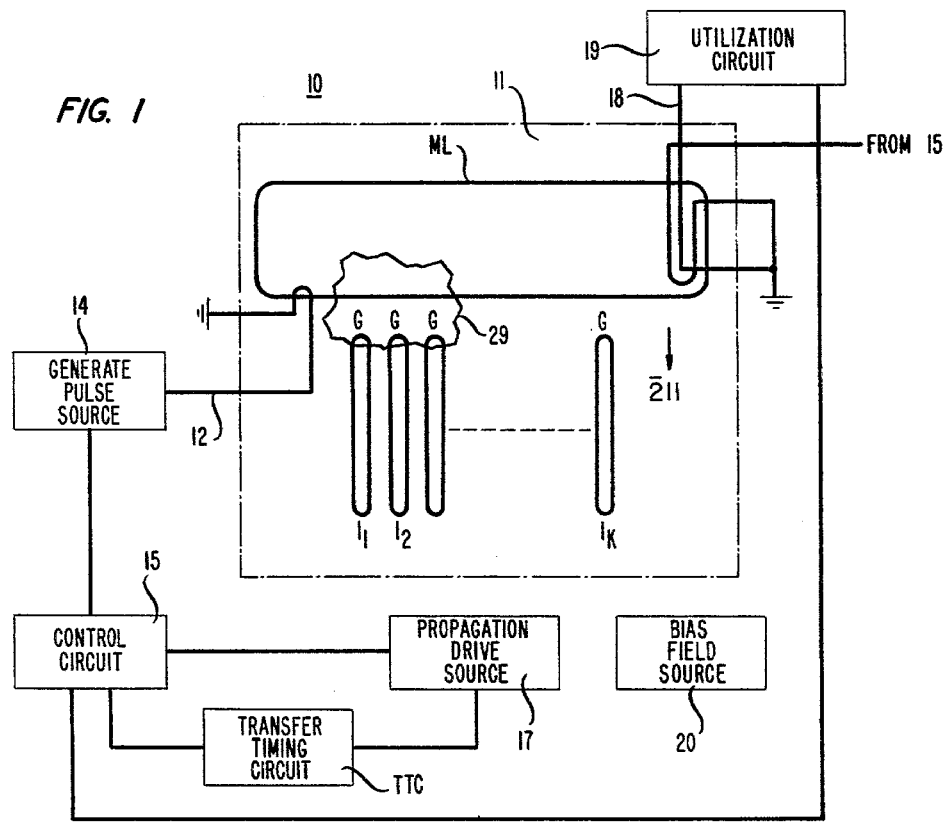
FIG. 1 is a block diagram of a bubble memory in accordance with this invention.

FIG. 1 shows a magnetic bubble memory 10 similar in type to one shown in the above-mentioned application of T. J. Nelson and R. Wolfe including a host layer 11 of a material in which magnetic bubbles can be moved. Bubbles are moved in layer 11 in closed loops $l_1, l_2 \ldots$ and $l_k$, the minor loops, and in a single loop ML, the major loop.

Permanent storage of data is provided by the minor loops. The major loop, on the other hand, provides for access to the minor loops of substitute data from a bubble generator and for read out of addressed data at a detector. In this connection, the generator comprises an electrical conductor 12 connected between a generate pulse source 14 and ground operative under the control of control circuit 15 to provide a pulse selectively during each cycle of a rotating in-plane propagation drive source represented by block 17. The detector similarly comprises, for example, a conductor 18 shown connected between utilization circuit 19 and ground.

Bubbles are maintained at a nominal diameter by a bias field supplied by source 20.

We will adopt the convention that data, generated at 12, moves counterclockwise about loop ML to transfer gates (G) at locations at the top ends of minor loops $l_i$ (as viewed) in response to successive rotations of the in-plane field (propagation cycles). Bubbles are transferred in and out of the minor loops in a manner to be described below.

The control of the transfer function as well as the generator, propagation and detector operation is derived from a master clock in accordance with well understood principles. Such circuitry along with an address register is considered to be included within control circuit 15.

The general organization of the memory of FIG. 1 thus can be seen to involve the generation of a bubble pattern at 12 for later storage in the minor loops by transfer at the transfer locations. Also involved is the transfer-out of addressed data from the minor loops by a similar transfer-out operation. The data advances to detector 18 for applying signals representative of the bubble pattern to utilization circuit 19. The selected data moves counterclockwise along loop ML until a later transfer-in operation occurs. This later transfer operation moves the data back into vacancies at the top of the minor loops as viewed.

In this connection, it is helpful to recall that bubbles usually are moving synchronously in all the loops of the memory. When a transfer-out operation occurs, vacancies are left in the addressed bit locations in the minor loops. Those vacancies move about the minor loops as the transferred data move to detector 18 and thereafter move in loop ML. The number of stages in the minor loops and the number in the major loop are chosen so that data transferred out or data generated at 12 arrive at the top end of the minor loops synchronously with those vacancies.

We are concerned herein primarily with a conductorless strategy for implementing the transfer-in and the transfer-out operation. In the embodiment of FIG. 1 both transfer operations occur at the top of the minor loops at transfer locations (or gates) designated G in the figure. The implementation requires an arrangement of ion-implanted regions at each gate. Transfer is responsive to variations in the normal cycle of the propagation drive field supplied by source 17 under the control of control circuit 15. The variation is initiated by the selection of an address for reading out a stored word or by a write operation for storing a substitute word at a selected address. In either case, transfer timing circuit TTC alters the normal propagation sequence in a manner to be described. At this juncture in the description it should be apparent that we are directing attention to ion-implanted magnetic bubble memories of the major-minor type wherein transfer gates between the major path and the minor loops also are defined by ion-implantation and are responsive to controlled deviations (viz: reversals) in a normal cycle of the propagation drive field.

Figure 2:
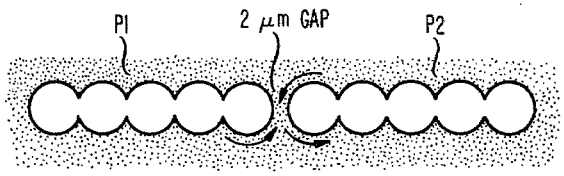
FIG. 2 shows a prior art configuration for a merge port.

FIG. 2 shows a prior art arrangement which demonstrates the principle upon which this invention is based. The figure shows a merge between two paths $P_1$ and $P_2$ defined at the periphery of contiguous discs of unimplanted material in an otherwise implanted layer. Paths $P_1$ and $P_2$ are separated by a gap which has an axis which aligns with one of the axes of symmetry of the magnetic garnet layer in which the discs are formed. This merge is shown in the above-mentioned patent of Nelson and Wolfe and for an $8\mu$ period circuit, the gap is $2\mu$ wide. The arrows show the direction of propagation for a bubble in the vicinity of a gap for a counterclockwise rotating in-plane field. Bubbles on the upper side of path $P_2$ pass freely through the gap and simply propagate around path $P_2$. Bubbles approaching the gap from path $P_1$, on the other hand, enter the gap from below, proceed as if a cusp were present and continue on a horizontal path to path $P_2$. Bubbles that transfer onto path $P_2$ in this way are then trapped on that path and will propagate around path $P_2$. If the direction of rotation of the in-plane field is reversed, bubbles will propagate in the opposite direction, but bubbles approaching the gap from above will still pass through freely and those approaching from below will proceed as if a cusp were present. In this way, bubbles are "trapped" on path $P_1$. In FIG. 2, the bottom side of the path is referred to as the strong side and the top side of the path is referred to as the weak side.

Figure 3:
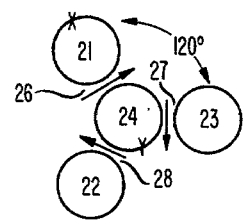
FIG. 3 shows a top view of a hypothetical ion-implanted pattern defining three merge gap orientations.

Because the (111) magnetic garnet layer has a threefold anisotropy, symmetry considerations indicate that gaps with orientations differing from that in FIG. 1 by $\pm 120$ degrees will display analogous behavior. FIG. 3 shows these three merge gap directions, for a downward orientation of the $(\overline{2}11)$ axis consistent with the arrangement of propagation loops shown in FIG. 1. Imaginary discs 21, 22, 23, and 24 are separated by gaps 26, 27, and 28 which are oriented at 120 degrees to each other. The arrows indicate the directions in which bubbles pass freely through gaps. This figure can be used as a reference for FIGS. 4-6 to determine the behavior of a bubble at a gap. As an example of bubble motion with respect to gaps in this type of configuration, consider a bubble at point x of disc 21. If the drive field rotates counterclockwise, the bubble moves counterclockwise along the periphery of disc 21 and approaches gap 26. As indicated by the arrow, it passes through the gap. Thus, in a field rotating counterclockwise, a bubble originating at point x simply propagates continually around disc 21. Consider, however, a bubble at point x in a clockwise rotating field. This bubble approaches gap 26 from the right, but rather than passing through, it proceeds as if the gap were a cusp and transfers to disc 24. The bubble next encounters gap 27. We see that it passes through this gap, and then propagates clockwise around disc 24. Suppose, however, that when the bubble after having passed through gap 27, is at point y on disc 24, the direction of rotation of the drive field is reversed. The field now rotates counterclockwise and the bubble "backs up" and approaches gap 27 again. This time, however, it approaches from the "strong" side and proceeds as if the gap were a cusp, transfers across the gap to disc 23, where it remains as long as the field rotates counterclockwise.

Figure 4:
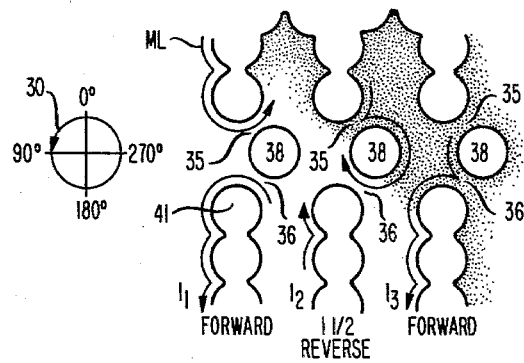
FIGS. 4 and 5 are enlarged top views of portions of the memory of the type shown in FIG. 1 demonstrating various embodiments of this invention.

FIG. 4 shows enlarged a top view of a portion of the transfer gate region 29 of the memory of FIG. 1. A pattern of unimplanted contiguous discs is arranged to define major path ML and minor loops $l_1$, $l_2$, and $l_3$ as shown. FIG. 4 also shows a circular arrow 30 directed in a counterclockwise direction and representing the drive field vector as it sweeps through the 0, 90, 180, and 270 reference directions as marked. It will be demonstrated now that the pattern of ion-implanted regions of FIG. 4 is operative to transfer a pattern of bubbles between major path ML and the minor loops.

Bubbles move counterclockwise in the various paths in response to a counterclockwise drive field. Bubbles in loop ML simply propagate around the loop, passing freely through gaps 35. Similarly, bubbles in the minor loops remain in those loops and pass freely through gaps 36. Transfer from the major loop to the minor loops requires a properly timed reversal of the direction of rotation of the drive field. The reverse rotation for achieving transfer into the minor loops is initiated when the drive field is in the 270-degree orientation shown in FIG. 4, bubbles in the major loop having just passed through gap 35. The bubbles in the major loop, in response, move clockwise about associated discs 38 to associated gaps 36. The bubbles pass through associated gaps 36 and, after one and one half clockwise rotations of the in-plane field, come to rest at the 90-degree positions on associated discs 38. Now the field reverses again to resume counterclockwise rotation. The bubbles, encountering gaps 36 now from the "merge" side, cross the gaps and transfer to the minor loops for continuing counterclockwise movement thereabout.

Transfer from the minor loops to the major loop is similar, with reverse rotation starting at a 90 degree orientation and ending at at a 270 degree orientation. In this transfer-out operation, a bubble in a minor loop passes through gap 36. When it reaches the 90-degree orientation on disc 41, circuit TTC of FIG. 1, under the control of control circuit 15, reverses the field and the bubble, now moving clockwise, transfers to the associated disc 38. When the bubble has passed through gap 35, circuit TTC resumes counterclockwise rotation of the drive field and transfer to the major loop is completed.

In this reverse rotation transfer process, the neighbors of the transferred bubbles on both the upper and the lower loops suffer no net disturbance, simply moving back and forth synchronously with the field rotation changes. It should be clear at this juncture that a controlled reverse rotation excursion of the bubble drive field causes movement of a bubble pattern from the major loop to the minor loops and vice versa depending on the direction of the drive field when the excursion commences. Consequently, a pattern of bubbles generated by pulses in conductor 12 of FIG. 1 can be moved into vacancies in the minor loops and bubbles in the minor loops can be moved into the major loop for detection by conductor 18 for applying signals to circuit 19 all under the control of control circuits 15 as has been stated hereinbefore.

A "major-minor" bubble memory with transfer-in and transfer-out functions being carried out at the same end of the minor loops is implemented with what is commonly called a "bilateral" transfer. Often, the separate transfer functions are implemented at opposite ends of the minor loops. In cases like these, the major loop encompasses the minor loops at both ends forming a G-shaped path or a double U-shaped path as is now well known.

Figure 5:
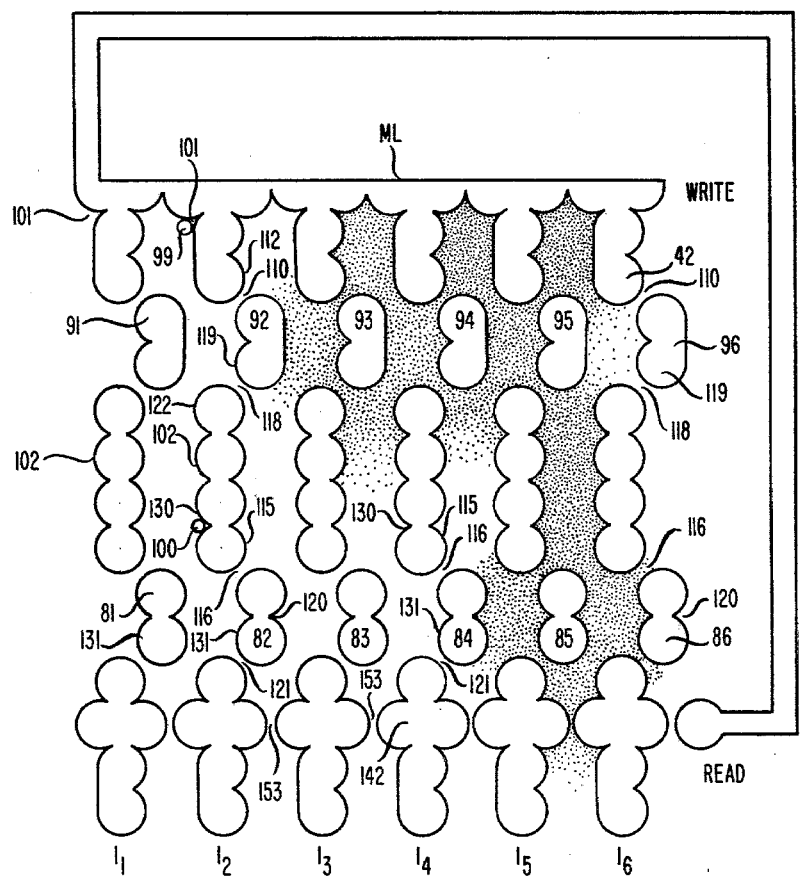

FIG. 5 shows a top view of an ion-implanted pattern which defines a minor loop field with separate transfer-in and transfer-out functions at opposite ends of the minor loops. The transfer implementation in each instance is designed either for transfer-in or for transfer-out but not both. They are not bilateral transfer implementations as shown in FIG. 4. The figure includes minor loops $l_1-l_6$ with major loop ML encompassing the minor loop field both on the transfer-out side and on the transfer-in side. Unimplanted islands (double discs) 81 to 86 and 91 to 96 define transfer-out and transfer-in locations, respectively. We will first consider the motion of a bubble being transferred out of minor loop $l_2$ and the synchronous motion of a bubble at the lower end of loop $l_1$. We will assume our two bubbles 99 and 100, start in positions 101 and 102. The field rotates counterclockwise until it points in the 270 degrees direction as shown in FIG. 4. Bubble 99 has passed through gap 110 and occupies position 112. Bubble 100 occupies position 115 after having passed through gap 116. The direction of rotation of the in-plane field now reverses for one and one half cycles. During this time, bubble 99 crosses gap 110, moving along island 92 and passing through gap 118 to occupy position 119 while bubble 100 crosses gap 116 and comes to rest on cusp 120. The bubble (100) does not pass through gap 121. Counterclockwise rotation of the field is resumed and after one and one half rotations, bubble 99 has transferred to loop 12 across gap 118 and occupies position 122 while bubble 100 has moved back across gap 116 to loop $l_2$. We see that even with a bubble at the end of the minor loop, no improper transfer-out occurs during the transfer-in process. However, since the illustrative transfer-out process requires two and one half reverse rotations, it is necessary to arrange that the write line is empty during transfer-out so that unwanted simultaneous transfer-in will not occur.

Transfer-out occurs as follows: A bubble, originally occupying position 130 on minor loop $l_4$ passes through gap 116 to position 115. The field reverses and after two and one half reverse rotations from 270 degrees to 90 degrees, brings the bubble through gap 121 to position 131. Normal, counterclockwise rotation resumes and the bubble crosses gap 121 to island 142 which is part of the major loop. The bubble propagates counterclockwise along the periphery of this island, freely passing through gap 153 and then propagating along the lower sides of island 142 moving to the right as viewed along the adjacent like-shaped islands.

Figure 6:
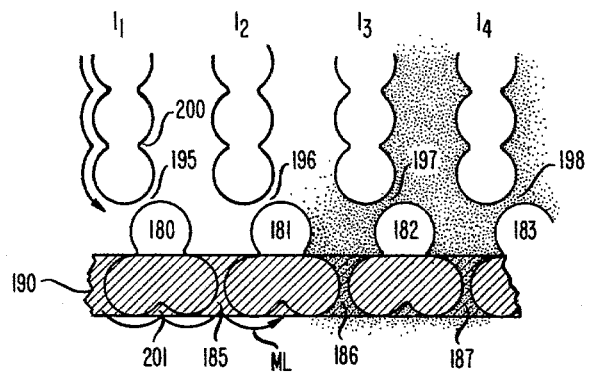
FIG. 6 is an enlarged top view of an alternative memory.

FIG. 6 shows a "hybrid" transfer gate which employs both conductor and reverse rotation-controlled transfer-in. The figure shows the lower ends of minor loops $l_1-l_4$ as well as a major path ML formed by unimplanted islands 180–183 separated by gaps 185–187. Also shown is transfer conductor 190. Normal bubble propagation is from left to right along major path ML formed by the lower edges of islands 180–183. Bubbles encountering gaps 185–187 treat them as cusps because, as we see from FIG. 2, the direction of free passage is from top to bottom through these gaps. Transfer-in is accomplished by pulsing transfer conductor 190, connected to a transfer pulse source (not shown) to drive bubbles through gaps 185–187. No reverse rotation is needed, because bubbles, once moved above the gaps, thereafter simply move along the tops of islands 180–183, treat gaps 195–198 like cusps, and thereby transfer to minor loops $l_1-l_4$. Transfer-out is accomplished by three cycles of reverse rotation. Reversal of the in-plane field causes a bubble at position 200, for example, to cross gap 195 as if it were a cusp, propagate around island 180 and pass through gap 185 and come to rest in cusp 201. When counterclockwise field rotation is resumed, the bubble then propagates along major path ML from left to right.

This hybrid transfer gate has the advantage that, contrary to what happens in the other reverse rotation gates, there is no net gain or loss in the transfer-in/transfer-out combination, so that with appropriately adjusted major and minor loop counts, a block of data may be transferred-out of the minor loops and propagate around the major loop an arbitrary number of times before being transferred back to its proper place in the minor loops. A power failure recovery scheme is therefore not constrained to advance the block only to the first arrival at the transfer gates.

We claim:

1. A magnetic bubble memory comprising a layer in which bubbles can be moved, said layer having a threefold axis of symmetry defining a preferred magnetization direction in the plane of said layer, means for providing a magnetic field reorienting cyclically in the plane of bubble movement, means for changing the direction of said in-plane field selectively, a pattern of ion-implanted regions in said layer defining at least first and second paths along which bubbles can be moved in response to said in-plane field, said pattern also defining means for transferring a bubble from said first to said second path in response to a temporary change in the direction of said in-plane field.

2. A magnetic bubble memory in accordance with claim 1 wherein said first and second paths are defined by contiguous unimplanted discs in an otherwise ion-implanted area, said means for transfer comprises an unimplanted island offset from said first and second paths and separated from said paths by gaps aligning with said preferred magnetization direction.

3. A magnetic bubble memory in accordance with claim 2 wherein said means for transfer is also operative to transfer bubbles from said second path to said first path.

4. A magnetic bubble memory in accordance with claim 3 wherein said pattern defines a plurality of closed loop second paths having first and second ends and at least one first path having positions associated with said first ends of said second paths, said transfer means being operative to transfer bubbles between said first ends and said first path.

5. A magnetic bubble memory in accordance with claim 2 wherein said pattern defines a plurality of closed loop second paths having first and second ends and at least one first path having positions associated with said first and second ends of said minor loops, said transfer means being operative to transfer bubbles from said first path to said second paths at said first ends and from said second paths to said first path at said second ends.

6. A magnetic bubble memory in accordance with claim 5 wherein said first path is defined by a series of unimplanted multistage islands separated by implanted gaps, each of which is associated with a different second path at said first ends.

7. A magnetic bubble memory in accordance with claim 6 wherein said implanted multistage islands are separated from said first ends of said second paths by gaps aligning with said axis of symmetry.

8. A magnetic bubble memory in accordance with claim 7 including a strip of electrically conducting material overlying said major path.

9. A magnetic bubble memory in accordance with claim 8 operative to transfer bubbles from said first path to said second paths in response to a pulse on said conductor and to transfer bubbles from said second paths to said first path in response to a reversal of the direction of rotation of said in-plane field.

10. A magnetic bubble memory comprising a layer in which bubbles can be moved, said layer having a threefold axis of symmetry defining a preferred magnetization direction in the plane of said layer, drive means for providing a magnetic field reorienting cyclically in the plane of bubble movement, a pattern of ion-implanted regions in said layer for defining at least first and second paths and a gap therebetween, said gap having an axis aligned with said preferred magnetization direction in a manner to permit a bubble in said paths to pass freely therethrough in a first direction but not in a second direction, said in-plane field being operative normally to move bubbles in said first direction through said gap, said memory being characterized by means cooperative with said drive means for altering said drive field in a manner to move a bubble in a second direction into said gap for transferring said bubble from said first to said second path.

* * * * *